United States Patent
Xu

(10) Patent No.: US 7,429,939 B2
(45) Date of Patent: Sep. 30, 2008

(54) SIGNAL ANALYSIS USING DUAL CONVERTERS AND CROSS SPECTRUM

(75) Inventor: Fang Xu, Newton, MA (US)

(73) Assignee: Teradyne, Inc., North Reading, MA (US)

( * ) Notice: Subject to any disclaimer, the term of this patent is extended or adjusted under 35 U.S.C. 154(b) by 0 days.

(21) Appl. No.: 11/540,773

(22) Filed: Sep. 30, 2006

(65) Prior Publication Data

US 2008/0079623 A1   Apr. 3, 2008

(51) Int. Cl.
*H03M 1/10* (2006.01)
(52) U.S. Cl. ..................... 341/120; 341/155
(58) Field of Classification Search ............ 341/155, 341/118, 120; 708/603, 300, 322; 375/328, 375/355.371; 702/190
See application file for complete search history.

(56) References Cited

U.S. PATENT DOCUMENTS

| | | | |
|---|---|---|---|
| 4,763,105 A * | 8/1988 | Jenq .................... 341/120 |
| 5,936,576 A | 8/1999 | Shimura | |
| 6,384,756 B1 * | 5/2002 | Tajiri et al. .................. 341/120 |
| 6,516,038 B1 * | 2/2003 | Ohta et al. .................. 375/328 |
| 6,522,282 B1 * | 2/2003 | Elbornsson ................ 341/155 |
| 6,784,819 B2 | 8/2004 | Chow ........................ 341/155 |
| 6,801,145 B2 * | 10/2004 | Asami ........................ 341/118 |
| 7,049,984 B2 * | 5/2006 | Wood et al. ................. 341/120 |
| 7,084,793 B2 * | 8/2006 | Elbornsson ................ 341/118 |
| 2007/0299635 A1 * | 12/2007 | Lang et al. .................. 702/190 |

* cited by examiner

*Primary Examiner*—Peguy JeanPierre
(74) *Attorney, Agent, or Firm*—Bruce D. Rubenstein

(57) ABSTRACT

A technique for examining the frequency content of an analog signal includes sampling the analog signal using two analog-to-digital converters clocked at the same rate but offset with respect to each other by a delay. The technique involves computing a cross spectrum of one converter's output with respect to the other's. Owing to the delay between the converters, different frequencies of the analog signal are represented as different phases in the cross spectrum, thus allowing input frequencies to be inferred.

20 Claims, 3 Drawing Sheets

US 7,429,939 B2

SIGNAL ANALYSIS USING DUAL CONVERTERS AND CROSS SPECTRUM

(B) CROSS-REFERENCES TO RELATED APPLICATIONS:

Not Applicable.

(C) STATEMENT REGARDING FEDERALLY SPONSORED RESEARCH OR DEVELOPMENT:

Not Applicable.

(D) NAMES OF PARTIES TO A JOINT RESEARCH AGREEMENT:

Not Applicable

(E) REFERENCE TO A "SEQUENCE LISTING," A TABLE, OR A COMPUTER PROGRAM LISTING APPENDIX:

Not Applicable.

(F) BACKGROUND OF THE INVENTION

1. Field of the Invention

This invention relates generally to the analysis of electronic signals, and, more particularly, to the analysis of the frequency content of electronic signals using parallel analog-to-digital converters.

2. Description of Related Art

A need commonly arises in electronic applications for analyzing the frequency content of electronic signals. One of these applications is automatic test equipment, or ATE. ATE systems, or "testers," are generally complex electronic systems for verifying the operation of electronic devices or assemblies.

FIG. 1 is a high level block diagram of a tester. A host computer 110 runs a test program developed for testing a unit under test, or UUT 118. The host computer 110 interactively communicates with a clock distribution circuit 112 and source/capture instruments 114. These instruments provide stimuli to and monitor responses from the UUT 118 via an interconnect 116. Examples of testers are well known in the art, and include the Catalyst™, Tiger™, and Panther™ test systems designed by Teradyne, Inc. of North Reading, Mass.

In ATE as well as other applications, frequency analysis of electronic signals is generally conducted using a combination of measurement and computation. Conventionally, electronic signals are digitized by a device called an analog-to-digital converter, or "ADC." The ADC is induced to acquire discrete samples of an analog signal at regular intervals of time. The samples emerge from the ADC as numeric codes, for which each code represents the level of the analog signal at the instant the respective sample is taken. The codes are then mathematically manipulated, using an algorithm called a discrete Fourier transform, or DFT, to produce the desire power spectrum. The power spectrum gives information about the amplitude and phase of frequency components that make up the original analog signal.

As is known, a limitation of this technique is that the digital output of the ADC can only unambiguously represent the analog input signal over a certain maximum bandwidth. This bandwidth is known as the "Nyquist bandwidth," and equals $F_S/2$, where $F_S$ is the sampling frequency. The first interval of the Nyquist bandwidth, or "Nyquist band," starts at DC and ends at $F_S/2$. The frequency $F_S/2$ is sometimes referred to as the "Nyquist rate."

If the analog signal has a bandwidth greater than the Nyquist bandwidth, frequency components falling outside the Nyquist bandwidth are manifested as errors in the sampled data, known as aliasing. Aliasing can be avoided by ensuring that the analog signal is band limited (e.g., filtered), so that its frequency content is contained within one Nyquist band. Generally, this means low pass filtering the analog signal so that it is rolled off at or before the Nyquist rate.

For analyzing signals having greater bandwidths, designers have sought to develop faster ADCs. Faster ADCs allow $F_S$, and therefore the Nyquist bandwidth, to be increased. As is known, however, faster ADCs tend to be more costly than conventional designs. They also tend to sacrifice accuracy in exchange for speed.

Another approach is to use multiple, interleaved ADCs connected in parallel. One example of this approach is shown in FIG. 1. There, M different ADCs 110a-110m each have an input connected to an input node, Analog In. Each ADC also has an output connected to a selector 114. The ADCs each receive a clock signal (C1-CM), which induces them to convert their respective analog input signals to digital output signals. The clock signals are generally produced by the clock distribution circuit 112 of the ATE system. Each of the clock signals has a frequency $F_S$, and each is delayed with respect to its predecessor. Intervals between successive clock signals are preferably identical and have a value equal to $1/(MF_S)$. This arrangement ensures that the analog input signal is sampled uniformly at a rate $MF_S$, while each ADC operates at a rate of only $F_S$.

The digital output signals from the ADCs 110a-m are interleaved to create a stream of digital values (Digital Out) that honorably represents the analog input signal as a function of time. A common method of interleaving is shown. A selector 114 has M inputs that receive the digital output signals from the ADCs. The selector 114 also has a control input connected to a counter 116. The counter is clocked at a frequency $MF_S$, and is made to cyclically count between 0 and M-1. For each count of the counter 116, the selector 114 selects a different one of its inputs for conveyance to its output. In this manner, the selector 114 assembles Digital Out from the values of the ADCs, in the right order. A capture memory 218 receives and stores values of Digital Out, and a processor 120 acts upon the stored values for computing power spectra or for otherwise analyzing or processing the signal.

Since the interleaved topology of FIG. 1 has an effective sampling rate of $MF_S$, it has an effective Nyquist bandwidth of $MF_S/2$ and represents a factor of M improvement over the single converter topology.

The interleaved topology of FIG. 1 offers great benefits, but they come at a cost. Just as speed is increased by a factor of M, so is cost and complexity.

What is needed is a less complex and less costly approach to analyzing the frequency content of high speed analog signals.

(G) BRIEF SUMMARY OF THE INVENTION

In accordance with an embodiment of the invention, a method for analyzing the frequency content of analog signals includes sampling an analog signal with first and second ADCs (analog-to-digital converters) operating at the same frequency, $F_S$, but offset with respect to each other in time. The first and second ADCs respectively produce digital output signals D1 and D2. The method further includes computing a cross-spectrum of D1 with respect to D2. Owing to the time offset between the converters, phase values of the cross-spectrum correspond to frequencies present in the analog signal. Frequencies information about the analog signal can then be inferred.

According to another embodiment, a circuit for analyzing frequency content of analog signals includes a first ADC and a second ADC. The first ADC and the second ADC each have an analog input for receiving the analog signal and a digital output for providing digital output signals D1 and D2, respectively. Each ADC has a clock input for receiving a clock signal operative at a sampling frequency, $F_S$. The clock signal for the second ADC is delayed relative to the clock signal for the first ADC, thus ensuring that the second ADC samples the analog signal at a somewhat later point than the first ADC. A cross spectrum processor is coupled to the digital outputs of the first and second ADCs. The cross spectrum processor is constructed and arranged for computing a cross-spectrum of D1 with respect to D2. The cross spectrum processor is coupled to a frequency spectrum processor. The frequency spectrum processor is constructed and arranged for converting data from the cross spectrum processor into information about the frequency content of the analog signal.

According to a further embodiment, a circuit for examining the frequency content of an analog signal includes an analog input. First and second ADCs are coupled to the analog input and respectively produce digital output signals D1 and D2. Conversions of the second ADC are delayed relative to conversions of the first ADC. The circuit further includes means for computing a cross spectrum of D1 with respect to D2 and means for extracting frequency content of the analog signal from the means for computing a cross spectrum.

(H) BRIEF DESCRIPTION OF THE SEVERAL VIEWS OF THE DRAWINGS

(I) DETAILED DESCRIPTION OF THE INVENTION

As used throughout this document and particularly in the claims, the words "comprising," "including," and "having" are intended to set forth certain items, steps, elements, or aspects of something in an open-ended fashion. Unless a specific statement is made to the contrary, these words do not indicate a closed list to which additional things cannot be added.

Figure 3:
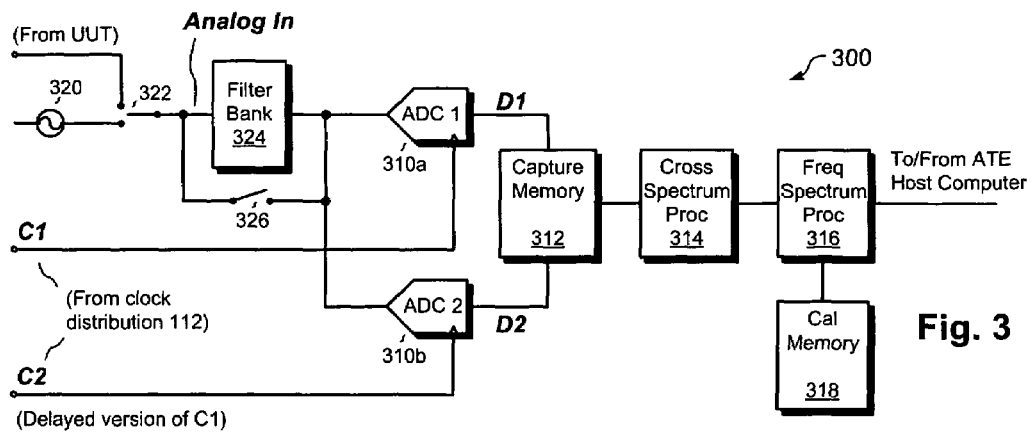
FIG. 3 is schematic view of a parallel, offset converter topology according to an embodiment of the invention.

FIG. 3 shows an illustrative embodiment of the invention. A circuit 300 includes a first ADC 310a and a second ADC 310b each having an analog input, a clock input, and a digital output. The analog inputs of the first and second ADCs are coupled to a first node, Analog In, for receiving an analog signal to be analyzed. The clock inputs of the two converters are coupled to respective clock nodes for receiving clock signals, C1 and C2. The clock signal C1 and C2 both operate at a frequency $F_S$; however, C2 is delayed with respect to C1. Preferably, the clock signals C1 and C2 are produced by the clock distribution circuit 112 of an ATE system.

The digital outputs of the first and second ADCs, respectively D1 and D2, are coupled to a capture memory 312. The capture memory is coupled to a cross spectrum processor 314. The cross spectrum processor 314 is coupled to a frequency spectrum processor 316.

The circuit 300 preferably includes additional elements. These include a calibration memory 318, a calibration source 320, a first switch 322, a filter bank 324, and a second switch 326.

The circuit 300 operates essentially as follows. The first and second ADCs 310a and 310b sample an incoming analog signal in parallel. The two converters acquire samples at the same rate ($F_S$), but at slightly different times. The delay between clock signals C1 and C2 ensures that the second ADC 310b acquires its samples later than the first ADC 310a. Digital output signals D1 and D2 thus differ from each other.

Figure 4:
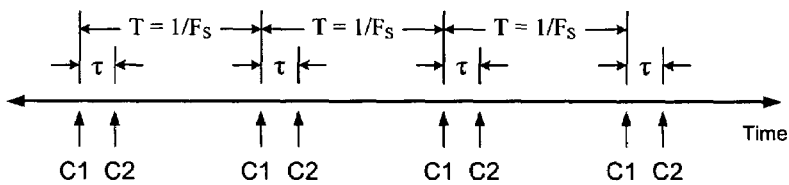
FIG. 4 is a timing diagram showing convert signals to the analog-to-digital converters of FIG. 3 offset in time.

FIG. 4 shows an example of the timing with which the converters 310a and 310b operate. The clock signal C1 for the first converter is seen to repeat at a regular sampling interval, $T=1/F_S$. The clock signal C2 for the second converter is seen to repeat at the same interval. What differs between the two clock signals is their relative timing. C2 is delayed with respect to C1 by a fixed interval, "TAU." TAU is identical from one sampling interval to the next.

We have recognized that a great deal of information can be gleaned from analyzing differences between D1 and D2. The cross spectrum processor 314 is used to reveal these differences.

It is known that the cross spectrum of $F_{12}(f)$ of two signals $f_1(t)$ and $f_2(t)$ is the forward Fourier Transform of the cross correlation function $R_{12}(T)$. The cross spectrum can also be obtained from the individual Fourier spectra $F_1(f)$ and $F_2(f)$:

$$F_{12}(f)=F'_1(f)*F_2(f), \text{ where } F'_1(f) \text{ is the complex conjugate of } F_1(f).$$

Substituting D1 and D2 (both functions of time) into this general expression, it is seen that the cross spectrum of D1 with respect to D2 is the Fourier transform of D2 times the complex conjugate of the Fourier transform of D1.

Preferably, the cross spectrum processor 314 operates by first computing the individual DFTs of D1 and D2. Then, it computes the complex conjugate of the DFT of D1. Finally, the cross spectrum processor multiplies the complex conjugate of D1 by the DFT of D2.

The cross spectrum is itself a Fourier transform; therefore, it presents data in the form of "bins," each having an associated amplitude and phase. Because the delay TAU is constant from one sampling interval to the next, a useful property emerges from the cross spectrum: the phase values of the cross spectrum vary in proportion to the frequencies present in the analog signal being sampled. With the cross spectrum computed, the frequency spectrum processor 316 extracts information about frequency components of the input signal.

Figure 5A:
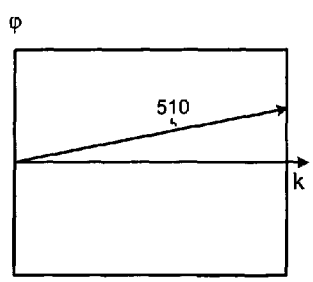
FIGS. 5a-5c are plots of phase versus cross spectrum bin acquired from the analog-to-digital converters of FIG. 3 under different sampling conditions.

FIG. 5a is a phase map that shows this property graphically. Cross spectrum phase is plotted as a function of cross spectrum bin. The left-most bin represents DC, and the rightmost bin represents $F_S/2$. Because TAU is fixed, it represents a progressively larger percentage of the period of any input signal as the frequency of that input signal is increased. The relationship is therefore linear. Double the input frequency, and the cross spectrum phase is doubled.

It can be seen from the line 510 of FIG. 5a that input frequency can be inferred directly from cross-spectrum phase. In particular, the frequency of an input signal can be calculated as the cross-spectrum phase divided by 2*PI*TAU.

As used herein the term "amplitude peak" describes a bin of a cross spectrum that has an amplitude notably larger than amplitudes of neighboring bins. For an input signal having a single tone, there is only one amplitude peak. To determine the frequency of a sinusoidal input signal, the frequency spectrum processor 316 identifies the amplitude peak in the cross spectrum produced by the cross spectrum processor 314. It then identifies the corresponding phase value for that bin, and divides the phase value by 2*PI*TAU.

Multi-tone signals, i.e., those having more than one frequency component, can be analyzed in a similar way. A typical cross spectrum for a multi-tone signal produces a number of amplitude peaks corresponding to the different frequency components of the input signal. For each amplitude peak, the frequency spectrum processor 316 preferably identifies the bin where the amplitude peak is found, identifies the corresponding phase value, and computes the corresponding frequency, by dividing the phase by 2*PI*TAU.

The cross spectrum of an input signal can also be used to determine other components or noise of the signal and/or of the circuit. Rather than searching only for amplitude peaks, the frequency spectrum processor 316 can examine any bin or all bins of the cross-spectrum. For each bin examined, a frequency value is determined based upon the cross spectrum phase, and an amplitude value is determined based upon the cross spectrum amplitude.

We have recognized that cross spectrum does not contain information about the relative phase of frequency components. However, since individual DFTs of the input signal are computed in any case, one needs only to refer to the phase values of the individual DFTs to identify the relative phase values of input signal components. Therefore, when all bins are analyzed, a power spectrum including both amplitude and phase can be computed. In addition, phase values extracted from the DFTs of the two ADCs 310a and 310b can be combined, e.g., by averaging, to improve signal-to-noise ratio of the relative phase readings.

For simplicity, the phase map of FIG. 5a is limited to input frequencies ranging from DC to $F_S/2$, i.e., frequencies ranging over one Nyquist band. A more revealing case is shown in FIG. 5b.

Figure 5B:
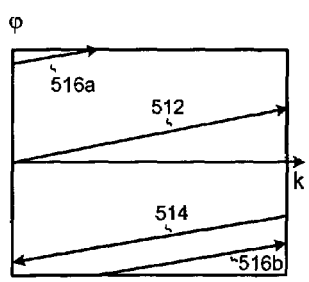

FIG. 5b shows a phase map extending over three Nyquist bands. The line 512 represents a first Nyquist band, which ranges from DC to $F_S/2$. This is the same as line 510 in FIG. 5a. However, the line 514 represents a second Nyquist band ($F_S/2$ to $F_S$), and the lines 516a and 516b represent a third Nyquist band ($F_S$ to $3F_S/2$). The fact that two lines 516a and 516b appear for the third Nyquist band reflects the fact that the phase scale extends from −180-degrees to +180-degrees. Therefore, line 516b is actually a continuation of line 516a.

Note that each line picks up where its predecessor ends, or rather at the negative thereof. A linear relationship is thus preserved. Input frequency is still computed by dividing cross spectrum phase, or rather its absolute value, by 2*PI*TAU.

From FIG. 5b, it is evident that a problem arises for line 516b, since some of the phase values on that line are the same as some of the phase values on line 514. Although the phase values are the same, they correspond to different frequencies. In the example of FIG. 5b, this problem arises after approximately 2.5 Nyquist bands. To avoid ambiguity, the input signal is preferably bandwidth limited to approximately 2.5 Nyquist bands. This can be done by low pass filtering the input signal (to select a low frequency band) or band pass filtering the input signal (to select a higher frequency band).

Within this bandwidth range (i.e., the "limiting bandwidth"), frequency components of single tone or multi-tone signals can be extracted from the cross spectrum. As described above, the frequency spectrum processor 316 needs only to identify bins of the cross spectrum containing amplitude peaks and to compute the frequency from the phase value at each peak.

Figure 5C:
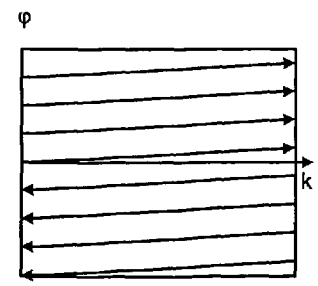

The circuit 300 can be adjusted to extend its limiting bandwidth. By reducing the delay time TAU, the slopes of the lines shown in FIGS. 5a and 5b are proportionally reduced. This reduction is shown in FIG. 5c. As is shown, a smaller value of TAU allows more Nyquist bands (lines) to be represented before ambiguity arises. With the example shown in FIG. 5c, the circuit 300 can detect frequencies covering a bandwidth of eight Nyquist bands ($4F_S$) before detection becomes ambiguous. Frequency range is thus extended remarkably.

Ideally, the limiting bandwidth can be extended indefinitely by making TAU arbitrarily small. Realistically, however, the effects of noise limit the useful range of the circuit 300. For any bin of the cross spectrum, noise has the effect of slightly raising or lowering the corresponding phase value. Thus, as TAU is reduced and Nyquist bands are piled more closely together, the likelihood increases that noise will cause a phase value to be mistakenly reported as belonging to the wrong Nyquist band.

Another source of ambiguity affects the circuit 300. As seen from FIG. 5c, individual bins of the cross spectrum may contain information about more than one frequency component. An example of this is where an input signal contains a first frequency component at $F_S/2-F_1$ and a second frequency component at $F_S/2+F_1$. Under this condition, the two frequency components will occupy the same bin of the cross spectrum. Their phases will add together, and their individual phase information—and therefore the corresponding frequency information—will be lost.

To avoid this circumstance, the circuit 300 is most advantageously used for analyzing "porous" input signals, i.e., those that have well spaced frequency components where overlap is unlikely to occur. This is often an agreeable constraint. In many circumstances, particularly in ATE, the frequency content of the input signal is approximately known in advance. There is an expected value, which a particular test program can either confirm or refute. For instance, a test program can include a test that stimulates a device (the UUT) at a known frequency. The test typically analyzes output from the device to confirm that it produces the same frequency in response to the stimulus.

Another way of ensuring that input frequencies are unambiguously detected is to band limit the input signal to a single Nyquist band. For non-porous input signals, different band pass filters of the filter bank 324 can be applied, and different Nyquist bands of the input signal can be analyzed in turn.

We have recognized that the circuit 300 behaves differently depending on whether TAU is an integer submultiple of the sampling interval, $T=1/F_S$. By "integer submultiple," it is meant that TAU evenly divides T without a remainder. Another way of expressing this is to say that TAU=T/M, where M is an integer.

FIG. 5c shows a case where M is an integer. In the figure and in general for this case, the phase map for the circuit 300 is precisely filled, meaning that there are no lines that partially extend off of the top of the phase map or extend up from the bottom (see lines 516a and 516b). Also, when M is an integer, we have found that there are precisely M Nyquist bands represented on the phase map. Frequency can thus be unambiguously inferred for porous input signals over a bandwidth of M Nyquist bands.

Where M is an integer, phase values corresponding to frequencies outside the M Nyquist bands can be shown to exactly retrace the lines for the M Nyquist bands shown. This fact allows porous signals to be unambiguously analyzed at any desired frequency level by bandwidth limiting the input signal to M Nyquist bands.

For instance, the input signal can be low pass filtered at $MF_S/2$, allowing unambiguous detection up to $MF_S/2$. Alternatively, the input signal can be band pass filtered around 2 $MF_S$, to choose an arbitrary value, provided the band pass filter attenuates signals below $3 MF_S/2$ and above $5 MF_S/2$. Frequencies of porous input signals can be unambiguously detected over M Nyquist bands in either case.

When M is not an integer (i.e., when TAU is not an integer submultiple of the sampling period), the lines representing out of band frequency components do not retrace after M bands. This arrangement has certain advantages, as well. Since the Nyquist bands (lines) do not retrace after M bands, the phase map becomes more densely packed. The greater density of Nyquist bands allows for a larger range of frequency detection, provided that the input signal is porous and/or filtered to avoid ambiguity.

Figure 6:
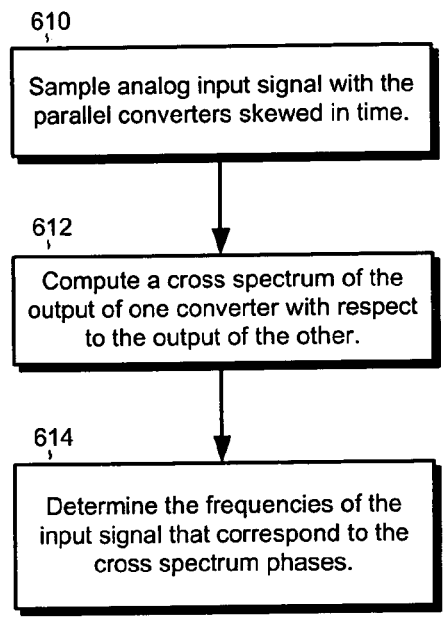
FIG. 6 is a flowchart showing a process according to an embodiment of the invention for determining the frequency content of analog signals.

FIG. 6 shows a process for analyzing frequency content of input signals and is a summary of the foregoing. At step 610, two parallel converters, skewed in time, are made to sample an input signal. At step 612, a cross spectrum is computed of the outputs of the converters relative to each other. At step 614, frequency information is extracted form the cross matrix.

The circuit 300 can be calibrated. If the delay time TAU is known with precision, and the ADCs 310a and 310b are acceptably accurate, calibration of the circuit 300 can be avoided. Typically, however, the delay time TAU is only approximately known and the ADCs have significant errors. Therefore, is usually desirable to calibrate the circuit 300.

Calibration is preferably conducted by attaching the calibration source 320 to the input of the circuit 300. The calibration source 320 preferably generates one or more sinusoidal signals. The responses of the circuit 300 are measured, and one or more calibration factors are derived for future use.

According to a simple calibration method, the calibration source is made to generate a sinusoidal input signal having a single tone of precisely known frequency $F_{CAL}$. For simplicity, $F_{CAL}$ is preferably less than $F_S/2$. The ADCs 310a and 310b sample the signal to produce digital output signals D1 and D2, respectively. The cross spectrum processor 316 computes the cross spectrum of D1 with respect to D2, and the frequency spectrum processor 316 identifies the bin with the amplitude peak corresponding to $F_{CAL}$. The cross spectrum phase at this bin, $P_{CAL}$, is noted, and a calibration factor is computed as $F_{CAL}/P_{CAL}$. Later, when input signals such as those from a UUT are measured, the circuit 300 can convert cross spectrum phase to frequency simply by multiplying cross spectrum phase by $F_{CAL}/P_{CAL}$.

A more elaborate calibration method involves configuring the calibration source 320 to produce different tones. These may be produced simultaneously or sequentially. For the simultaneous case, a calibration signal is produced having a number of frequency components. Again, for simplicity, each component preferably has a frequency less than $F_S/2$. The ADCs sample the calibration signal, and the cross spectrum processor 314 computes its cross spectrum. Amplitude peaks are identified, each is associated with a known frequency component of the calibration signal, and calibration factors are produced. Preferably, a different factor is produced for each tone. For the sequential case, different tones are applied to the circuit 300 one at a time, and a different calibration factor is produced for each tone.

Ideally, and regardless of whether tones are applied simultaneously or sequentially, the calibration factors should all be equal. Noise or circuit errors may cause them to be unequal, however. The different calibration factors may be dealt with in a variety of ways. They may simply be averaged, to arrive at an overall calibration factor applicable to all tones. Alternatively, they may be used to construct a calibration map.

The calibration map allows there to be a phase dependency to the calibration factor. The calibration factor for any given phase can be computed mathematically, based, for example, upon a best fit curve connecting phases for the different calibration tones. The curve preferably relates calibration factor to cross spectrum phase. Measured phase can then be corrected by identifying and applying the corresponding value of the curve.

Alternatively, discrete calibration factors can be stored in a lookup table. The lookup table relates phase to calibration factor. During normal operation, calibration factors for measured phases falling between values stored in the table can be interpolated.

The calibration factor(s), calibration curve, or lookup table are preferably stored in the calibration memory 318, for access by the frequency spectrum processor 316 during normal operation.

Figure 7:
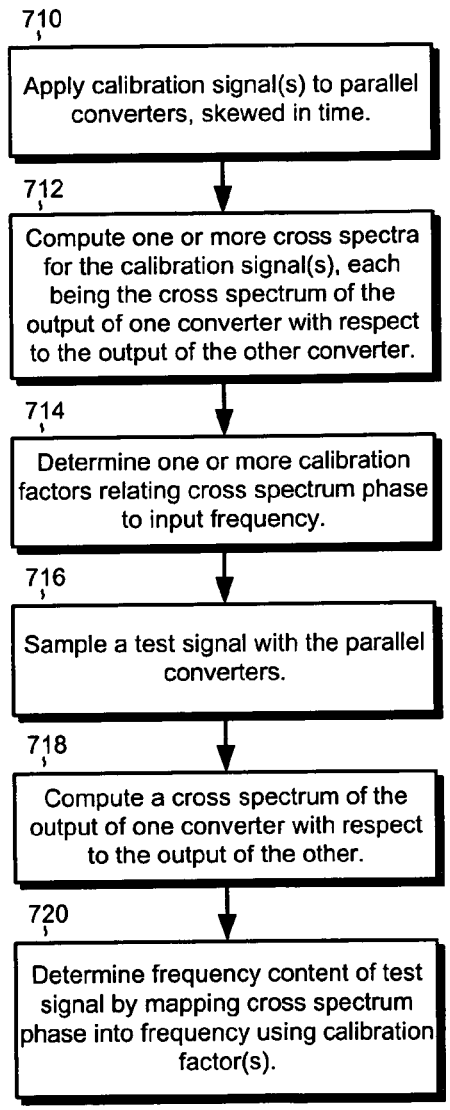
FIG. 7 is a flowchart showing a process according to an embodiment of the invention that employs calibration for measuring the frequency content of analog signals.

FIG. 7 summarizes various processes for calibrating and using the circuit 300. At step 710, one or more calibration signals are applied to the parallel converters, which are skewed in time. Each calibration signal can include a single tone or multiple tones. At step 712, a cross spectrum is computed for each of the calibration signals. At step 714, one or more calibration factors are determined. The calibration factor or factors can be expressed in a variety of ways. These include, for example, a single calibration factor, multiple factors averaged or otherwise combined to arrive at a single factor, a curve of calibration factor versus cross spectrum phase, or a list of discrete points (a lookup table) relating calibration factor to phase.

With the calibration factor(s) determined, accurate measurements and analyses of input signals can be conducted. At step 716, an input signal, such as a test signal from a UUT, is sampled with the skewed, parallel converters. At step 718, a cross spectrum is computed of the output of one converter with respect to the output of the other converter. At step 720, the frequency content of the input signal is determined, by applying the calibration factor(s) for converting, or mapping, the computed cross spectrum phase into frequency.

In the preferred embodiment hereof, the capture memory 312, cross spectrum processor 314, frequency spectrum processor 316, and calibration memory 318 are implemented in the form of a single DSP (digital signal processing) processor with memory. Alternatively, they can be implemented in one or more FPGAs (Field Programmable Gate Arrays), custom ASICs (Application Specific Integrated Circuits), or any computer processing device.

Preferably, the calibration source 320 is a precision AC source with very low harmonic distortion. In the ATE context, it is preferably a multi-purpose source included among the source/capture instruments 114. It is preferably connectable to the circuit 300 either directly or via the interconnect 116.

The switch 322 is preferably a form-C relay. In the ATE context, it can alternatively be implemented as part of the interconnect 116. The switch 326 is preferably a form-A relay and is used to bypass the filter bank 324 when filtering is not desired.

The filter bank 324 preferably includes a number of analog bandpass filters and low pass filters, connected in parallel. The filters are arranged so that only one of them is selectable at a time.

Figure 1:
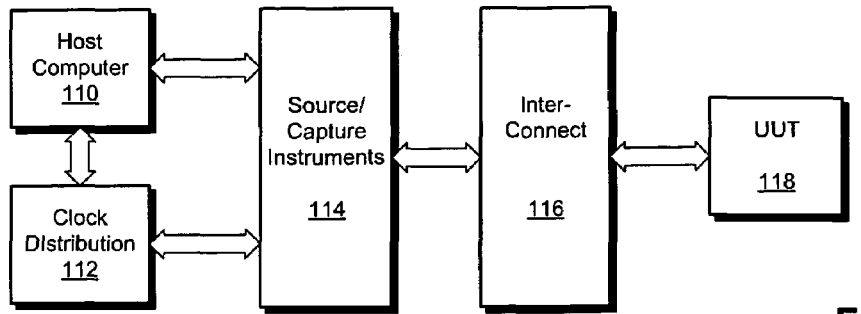
FIG. 1 is a simplified block diagram of automatic test equipment according to the prior art.
Figure 2:
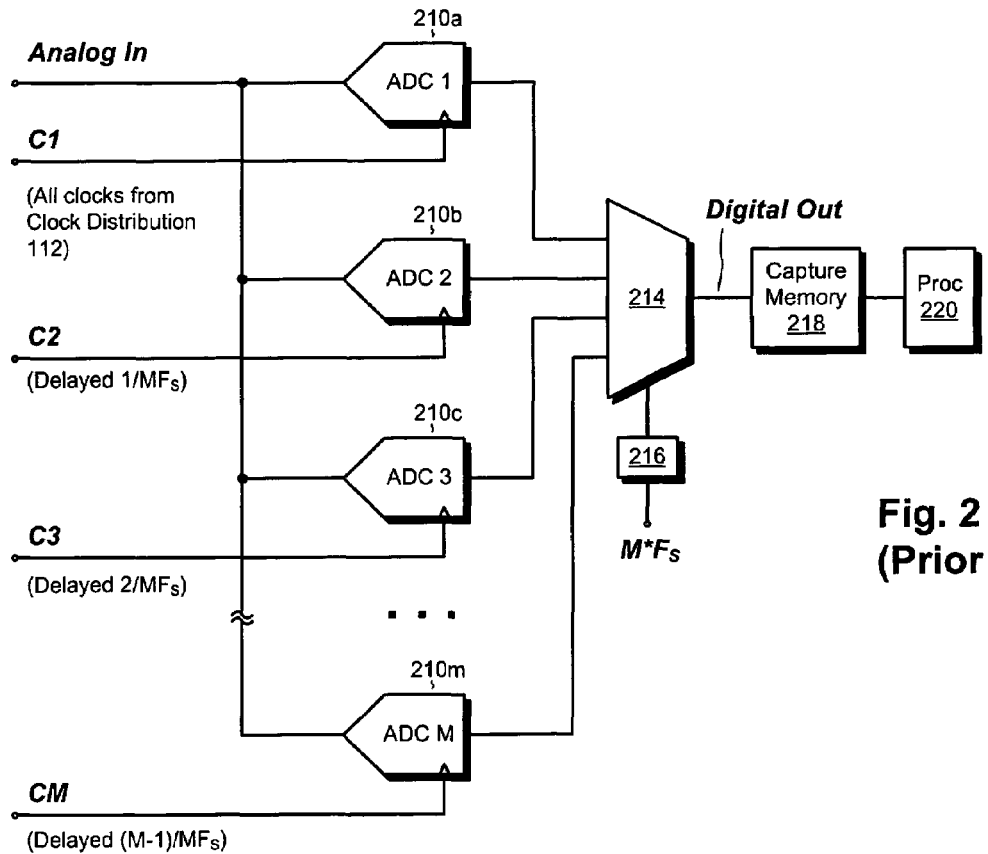
FIG. 2 is a schematic view of a parallel, interleaved analog-to-digital converter topology according to the prior art.

In the preferred embodiment, the frequency spectrum processor 316 is operatively connected to the ATE host computer 110 (see FIG. 1). This connection allows the host computer 110 to be notified of frequency analysis results, which in turn allows test programs running on the host computer to respond to these results (e.g., by issuing passing or failing test results).

The circuit 300 is preferably operated under the control of the host computer 110. The host computer 110 therefore preferably controls the issuance of the clock signals C1 and C2, the configuration of the calibration source 320 and switches 322 and 326, and the configuration of the filter bank 324.

During a typical testing session, the host computer 110 first directs calibration of the circuit 300 by configuring the switch 322 in its downward position, closing the switch 326, commanding the calibration source to produce the appropriate calibration signal(s), and directing the processors 314 and 316 to perform their respective computing functions. One or more calibration factors are then stored in the calibration memory 318. Then, for the actual testing of UUTs, the host computer 110 configures the switch 322 in its upward position. It configures the source/capture instruments 114 to stimulate the UUT (as needed), and configures the interconnect 116 to conduct output from the UUT to circuit 300 for analysis.

The circuit 300 employs only two ADCs. Yet it can be configured to analyze frequencies well above the sampling rate. For use in analyzing porous input signals, it achieves the same performance levels as implementations costing much more and having much greater complexity.

Having described one embodiment, numerous alternative embodiments or variations can be made. For instance, as shown and described, the clock signals C1 and C2 are preferably generated by the clock distribution circuit 112 of an ATE system. This is not required, however. The invention is not limited to ATE applications, so an ATE system is not required. Also, the clock signals may be generated by any suitable timing source. According to one variant, a single clock signal is provided for both converters, but the path to one converter is delayed with respect to the path to the other converter. The delay can be achieved in a variety of ways, such as by using a delay line, a vernier, one or more logic gates, or even a length of conductive trace. In any case, the manner of generating the clock signals is not critical to the invention.

As shown and described, the delay interval TAU is fixed. However, this is not required. Indeed, some benefits may be derived from allowing TAU to be variable. Since reducing the value of TAU increases the frequency detection range of the circuit 300 but also increases its susceptibility to noise, it is foreseeable that some applications will favor frequency range whereas others will favor noise immunity. Therefore, making TAU variable may be preferred in some instances. Since the circuit 300 is capable of being calibrated, the exact value of TAU need not be known in advance. If a particular application requires TAU to be established at a precise value, the clock distribution circuit 112 (or another timing source) can be made to iteratively vary the delay between C1 and C2 as values of TAU are computed, until the desired value of TAU is attained. Note that TAU is readily computed as $P_{CAL}/(2*PI*F_{CAL})$, where $P_{CAL}$ is the cross spectrum phase calculated in response to a frequency $F_{CAL}$.

As shown and described, the capture memory 312, cross spectrum processor 314, frequency spectrum processor 316, and calibration memory 318 are distinct hardware components. This is not required, however. These elements can be implemented using separate physical components, together within a single physical component, or via any combination of physical components. According to one implementation, the cross spectrum processor 314 and frequency spectrum processor are implemented as different groupings of software running on a computer. The computer may be a dedicated computer, such as a DSP processor, or another type of computer, such as the host computer 110 itself.

Those skilled in the art will therefore understand that various changes in form and detail may be made to the embodiments disclosed herein without departing from the scope of the invention.

What is claimed is:

1. A method of examining the frequency content of an analog signal, comprising:
    (A) sampling the analog signal with a first ADC at a rate $F_S$ to produce digital values D1;
    (B) sampling the analog signal with a second ADC at the rate $F_S$ to produce digital values D2, wherein second the ADC samples a delay interval TAU later relative to the analog signal than the first ADC;
    (C) computing a cross spectrum of D1 with respect to D2; and
    (D) identifying one or more frequency components of the analog signal responsive to the cross spectrum.

2. A method as recited in claim 1, wherein the cross spectrum has a plurality of bins each having an associated amplitude and an associated phase, and wherein the step (D) of identifying one or more frequency components comprises:
    for at least one of the plurality of bins, dividing the phase associated with the respective bin by a number proportional to the delay interval, TAU.

3. A method as recited in claim 2, wherein the number proportional to the delay interval TAU equals 2*PI*TAU.

4. A method as recited in claim 2, further comprising assigning an amplitude for each identified frequency component to be the amplitude of the respective bin of the cross spectrum.

5. A method as recited in claim 1, wherein the interval TAU is an integer submultiple of $1/F_S$.

6. A method as recited in claim 1, wherein the interval TAU is not an integer submultiple of $1/F_S$.

7. A method as recited in claim 1, further comprising, prior to the step (A):
    (i) applying a calibration signal having a known frequency to the first and second ADCs;
    (ii) sampling the calibration signal with the first and second ADCs at the rate $F_S$ to respectively produce digital values D1 and D2, wherein the second ADC samples the calibration signal the delay interval TAU later relative to the calibration signal than the first ADC;
    (iii) computing a cross spectrum of D1 with respect to D2, the cross spectrum having a plurality of bins each having an associated amplitude and an associated phase;
    (iv) identifying a bin of the cross spectrum corresponding to the known frequency; and
    (v) generating a calibration factor for later use in converting cross spectrum phase values to input frequency values, responsive to the known frequency of the calibration signal and the computed phase of the cross spectrum at the identified bin.

8. A method as recited in claim 7, wherein the calibration factor is a number by which phase values of the cross spectrum can be multiplied to yield frequency values.

9. A method as recited in claim 7, further comprising repeating steps (i)-(v) for calibration signals having different known frequencies, to produce different calibration factors.

10. A method as recited in claim 1, further comprising, prior to the step (A):
   (i) applying a calibration signal having a plurality of known frequency components to the first and second ADCs;
   (ii) sampling the calibration signal with the first and second ADCs at the rate $F_S$ to respectively produce digital values D1 and D2, wherein the second ADC samples the calibration signal the delay interval TAU later relative to the calibration signal than the first ADC;
   (iii) computing a cross spectrum of D1 with respect to D2, the cross spectrum having a plurality of bins each having an associated amplitude and an associated phase;
   (iv) identifying a plurality of bins of the cross spectrum corresponding to the plurality of known frequency components; and
   (v) generating a plurality of calibration factors for later use in converting phase values to input frequency values, responsive to known frequency components of the calibration signal and the computed phases of the cross spectrum at the identified bins.

11. A method as recited in claim 1, further comprising varying the delay interval TAU to arrive at a desired delay value.

12. A method as recited in claim 11, further comprising, prior to step (A), filtering the analog signal to restrict its frequency content to a single Nyquist band.

13. A method as recited in claim 1, wherein the analog signal is an output signal generated by a UUT (unit under test) as part of a test process for the UUT.

14. A circuit for examining the frequency content of an analog signal, comprising:
   an analog input;
   a first clock input for providing a first clock signal;
   a second clock input for providing a second clock signal, wherein the second clock signal is delayed relative to the first clock signal;
   a first ADC having an input coupled to the analog input, an output for producing a digital output signal D1, and a clock input coupled to the first clock input;
   a second ADC having an input coupled to the analog input, an output for producing a digital output signal D2, and a clock input coupled to the second clock input;
   a cross spectrum processor coupled to the outputs of the first and second ADCs, the cross spectrum processor being constructed and arranged for computing a cross spectrum of D1 with respect to D2; and
   a frequency spectrum processor coupled to the cross spectrum processor, the frequency spectrum processor being constructed and arranged for extracting information about the frequency content of the analog signal from the cross spectrum of D1 with respect to D2.

15. A circuit as recited in claim 14, further comprising a calibration memory coupled to the frequency spectrum processor, for storing at least one calibration factor that relates cross-spectrum phase values to input frequency values.

16. A circuit as recited in claim 14, further comprising a calibration source, selectively coupled to the analog input, for applying signals of known frequency content.

17. A circuit as recited in claim 14, further comprising a filter, coupled in series with the analog input.

18. A circuit for examining the frequency content of an analog signal, comprising:
   an analog input;
   a first ADC having an input coupled to the analog input and an output for producing a digital output signal D1;
   a second ADC having an input coupled to the analog input and an output for producing a digital output signal D2;
   means for delaying conversions of the second ADC relative to the first ADC;
   means for computing a cross spectrum of D1 with respect to D2; and
   means for extracting frequency content of the analog signal from the means for computing a cross spectrum.

19. A circuit as recited in claim 18, further comprising a calibration memory, coupled to the means for extracting, for storing at least one calibration factor used for extracting frequency information from cross spectrum information.

20. A circuit as recited in claim 18, further comprising an analog filter coupled between the analog input and the first and second ADCs.

* * * * *